United States Patent [19]
Lee et al.

[11] Patent Number: 6,028,330
[45] Date of Patent: Feb. 22, 2000

[54] CMOS SENSOR HAVING A STRUCTURE TO REDUCE WHITE PIXELS

[75] Inventors: Sheng-Ti Lee, Taipei; Chi-Ting Shen, Taipei Hsien; Chi-Fin Chen, Taipei; Chien-I Fu, Taipei; Chao-Jung Chen, Taipei; Wei-Jung Chen, Kaohsiung, all of Taiwan

[73] Assignee: Dyna Image Corporation, Taiwan

[21] Appl. No.: 09/128,564

[22] Filed: Aug. 4, 1998

[51] Int. Cl.[7] .................................................. H01L 27/148
[52] U.S. Cl. ........................ 257/229; 257/233; 257/446; 257/461
[58] Field of Search ..................................... 257/229, 230, 257/233, 446, 461, 506, 509, 225

[56] References Cited

U.S. PATENT DOCUMENTS 4,717,945   1/1988   Yusa et al. .............................. 257/230

*Primary Examiner*—Minh Loan Tran
*Attorney, Agent, or Firm*—Raymond Sun

[57] ABSTRACT

A sensor device has a field oxide layer deposited over a substrate. The field oxide layer has opposing sharp edges that define a window. A sensor is formed in the window with a distance between the sensor and each sharp edge that defines the window. The distance forms a gap that reduces the effects of the sharp edges on the sensor, thereby reducing the current leakage from the sensor. In addition, a protective layer may be disposed over the distance and the sharp edges of the field oxide layer to further protect the sharp edges from damage that may be caused from further processing.

10 Claims, 1 Drawing Sheet

CMOS SENSOR HAVING A STRUCTURE TO REDUCE WHITE PIXELS

BACKGROUND OF THE INVENTION

1. Field of the Invention

The present invention relates to sensor devices, and in particular, to methods and structures for reducing current leakage from the sensor device.

2. Description of the Prior Art

Sensor devices are commonly used in a wide variety of reading apparatus such as scanners, facsimile machines, copying machines, digital cameras, PC cameras, video phones, video conferencing apparatus, door phones, security systems and the like. There are two types of sensor devices. One is a lineartype and the other is an array-type. Each sensor device receives light that has been reflected from an object that is being read. The light that is received by the sensor device can have different intensities depending on the object that is being read. The different light intensities produce different electrical charges at the sensor device, which stores these charges in a capacitor. The electrical charge at the capacitor is then provided to a switching circuit that provides all the electrical signals from the array of sensor devices to a processor for processing and output.

FIG. 1 illustrates the structure of a conventional sensor device 10. The conventional sensor device 10 has a substrate 11 (such as a P-well, N-well, P-substrate or N-substrate) and a field oxide layer 12 that is used to isolate the sensor device 10 from adjacent sensor devices. After the field oxide layer 12 has been formed, impurity diffusion or ion implantation methods that are well known in the art are used to introduce impurities (e.g., phosphorus or boron ions, among others) into the substrate 11 from a diffusion machine or ion implanter, respectively, to form a sensor 13 adjacent the field oxide layer 12. Sensor 13 can also be considered to be a junction capacitor.

Field oxide layer 12 is made in a humid and oxygen-rich environment using a wet oxidation method as is well-known in the art. Unfortunately, liquid and oxygen gas have a lateral diffusion effect on the edges of sensor 13, thereby producing a slowly tapering oxide 14 that wedges itself into the sensor 13 area. This wedge is also known as a "bird's beak". Because of the stress experienced during the oxidation that takes place during the conventional manufacturing process for the CMOS integrated circuit (IC), crystal defects are often generated at the wedges or bird's beak 14. The stress is caused by the different pressures of two different materials, in which each has a different density.

The bird's beak 14 adjacent to the junction edge of the sensor 13 is susceptible to damage during the subsequent manufacturing steps for the CMOS IC. For example, plasma damage can be caused by dry etching, and implantation damage can be caused by ion implantation. If the damaged junction edge cannot be fully recovered in the subsequent IC processing steps, then a current leakage path may be created from the junction capacitor to the substrate 11. When the leakage is large, it is impossible to maintain the voltage level stored in the capacitor, so that when the sensor device 10 performs its read-out operation, the sensor 13 may produce a "white pixel" or "hot line" or "dead pixel" or "dead line".

A "white pixel" is a pixel output that is always high because there is no current output (i.e., no charge at the capacitor), so that it would always appear to be a white spot (i.e., zero pixel output) on the screen even though the output should represent a dark pixel. A "hot line" is a vertical or horizontal line of white pixels. A "dead pixel" is a pixel output that is always low because there is a maximum current output (i.e., fully stored charges at the capacitor), so that it would always appear to be a dead pixel (i.e., maximum level pixel output) on the screen even though the output should represent a bright pixel. A "dead line" is a vertical or horizontal line of dead pixels. The white pixels and hot lines, or dead pixels and dead lines, are produced because the voltage level at the sensor 13 is about the same as the voltage level in the substrate 11. When the substrate 11 is biased to GROUND voltage, white pixels and hot lines are produced. On the other hand, when the substrate 11 is biased to $V_{DD}$ voltage, dead pixels and dead lines are produced. White pixels, hot lines, dead pixels and dead lines can severely affect the accuracy of the output of a sensor device 10.

One attempt to address and solve the current leakage problem is to re-design the circuit. Unfortunately, this attempt will introduce complexity into the circuit design, thereby increasing costs, and may even impact the performance of the sensor device 10.

As a result, there still remains a need for sensor device that minimizes the leakage of current from the sensor, while at the same maintaining a high level of accuracy and performance.

SUMMARY OF THE DISCLOSURE

In order to accomplish the objects of the present invention, there is provided a sensor device having a field oxide layer deposited over a substrate. The field oxide layer has opposing sharp edges that define a window. A sensor is formed in the window with a distance between the sensor and each sharp edge that defines the window. The distance forms a gap that reduces the effects of the sharp edges on the sensor, thereby reducing the current leakage from the sensor.

In one embodiment of the present invention, the distance is greater than 0.5 um, and the sensor forms a P-N junction sensor area. The substrate may be either a P-well, N-well, P-substrate or N-substrate.

In another embodiment of the present invention, a protective layer may be disposed over the distance and the sharp edges of the field oxide layer to protect the sharp edges from damage that may be caused from further processing. The protective layer can be a CMOS layer that is used during the CMOS manufacturing, and may be made of a transparent material that may be either a dielectric, an insulative material, or a conductive material. The protective layer is also provided as a self-aligned mask for forming the sensor. The distance may be as small as 0.2 um.

The present invention also provides a method of making a sensor device, which includes depositing a field-oxide layer over a substrate, the field-oxide layer having opposing sharp edges that define a window, and then forming a sensor in the window while providing a distance between the sensor and each sharp edge that defines the window.

The present invention also provides another method of making a sensor device, which includes depositing a field-oxide layer over a substrate, the field-oxide layer having opposing sharp edges that define a window, depositing a protective layer over the sharp edges of the field oxide layer to cover the sharp edges, retaining the deposited protective layer during subsequent processing, and forming a sensor in the window. The protective layer may be deposited over the sharp edges of the field oxide layer and partially into the window. The sensor may be formed in the window while providing a distance between the sensor and each sharp edge that defines the window.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as not to obscure the description of the present invention with unnecessary detail.

Figure 2:
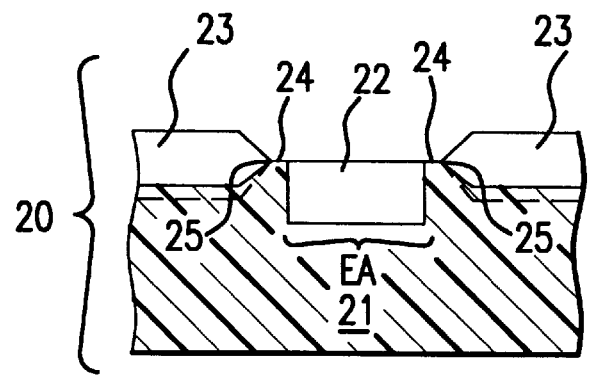
FIG. 2 is a cross-sectional view of a sensor device according to a first embodiment of the present invention.

FIG. 2 illustrates a sensor device 20 according to a first embodiment of the present invention. The sensor device 20 has a substrate 21, a sensor 22 (such as an N+ region), and a field oxide layer 23. In manufacturing the sensor device 20, the substrate 21 can be provided as a P-well, N-well, P-substrate or N-substrate. The field oxide layer 23 is then deposited on the substrate 21 to form an isolation between each sensor device 20. After the field oxide layer 23 has been formed, impurity diffusion or ion implantation methods (such as those conventional methods known in the art) are used to introduce impurities (e.g., phosphorus or boron ions, among others) into the substrate 21 from a diffusion machine or ion implanter, respectively, to form a sensor 22 adjacent the field oxide layer 23. Specifically, a photoresist is applied over the sensor device 20 and developed to define the desired location of the sensor 22. In other words, as with conventional photoresist techniques, the photoresist forms a protective shield to cover the locations of the sensor device 20 which will not be subject to impurity diffusion or ion implantation. To avoid the creation of leakage paths at the bird's beak or edge 25 of the field oxide layer 23, the photoresist is applied so that the sensor 22 will be positioned at a certain distance or gap 24 from the edge 25. The distance or gap 24 is preferably at least 0.5 um. Impurity diffusion or ion implantation is then used to form the sensor 22, after which the photoresist is removed. Sensor 22 can also be considered to be a P-N junction sensor area.

Thus, the sensor device 20 minimizes current leakage by reducing the leakage path effects of the bird's beak or edge 25 on the sensor 22. This significantly reduces the current leakage from the sensor 22, thereby minimizing the occurrence of the phenomenons of "white pixel", "hot line", "dead pixel" and "dead line". When comparing the sensor device 20 to conventional sensor devices 10, the improved results of the sensor device 20 are significant. For example, in conventional sensor devices 10, the number of white pixels (or hot lines or dead pixels or dead lines) in one chip ranges from about 3 to 25, and the number of chips in a wafer which do not exhibit white pixels is about 10%. In contrast, in sensor device 20, the number of white pixels in one chip ranges from about 0 to 15, and the number of chips which do not exhibit white pixels is about 45%, thereby improving the yield rate from 10% to 45%.

By providing a distances or gaps 24 between the sensor 22 and the field oxide layer 23, the effective area (EA) of the sensor 22 is also reduced since the area occupied by the distances or gaps 24 would have previously been part of the effective area of the sensor 22. The sensor area of the sensor device 20 can be defined as extending from one field oxide edge 25 to the other field oxide edge 25, but the effective sensor area EA is the area defined by the sensor 22. Since the effective area of the sensor 22 will be slightly decreased, the capacitance in the sensor 22 will also be decreased, so that when light is received by the sensor 22, the charge (Q) that is produced and which can be stored will be decreased. Thus, the sensitivity and dynamic range of the sensor device 20 will be less than normal, depending on the amount of decrease of the effective area EA of the sensor 22. Sensitivity can be defined as the output produced as a result of the intensity of light impinging on the sensor 22, and can be expressed by voltage/lux-sec. Dynamic range can be defined as the voltage range within which the sensor 22 is able to detect (i.e., display) from dark images from light images.

Figure 1:
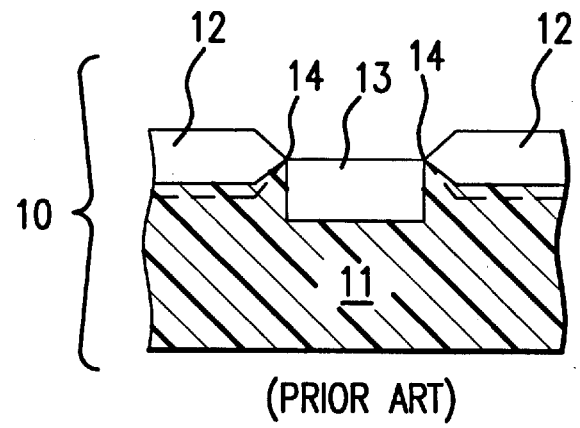
FIG. 1 is a cross-sectional view of a conventional sensor device.
Figure 3:
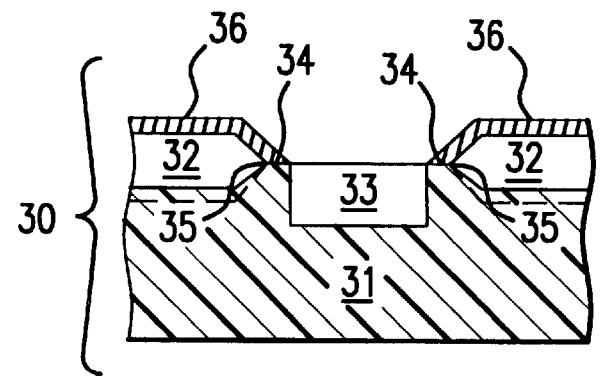
FIG. 3 is a cross-sectional view of a sensor device according to a second embodiment of the present invention.

The present invention provides another sensor device 30 that reduces the current leakage while maintaining a sensor effective area (EA) that may be slightly smaller when compared with conventional sensor device 10, but will be larger when compared with the sensor device 20. Referring to FIG. 3, the sensor device 30 has a substrate 31, a field oxide layer 32, and a bird's beak or edge 35 that can be made according to the conventional sensor device 10 described in FIG. 1.

The sensor device 30 of present invention additionally provides a protective layer 36 that is preferably a CMOS layer that is used during the CMOS manufacturing process (such as a poly layer). This layer is typically applied during the conventional CMOS manufacturing process anyway because it is needed for the formation of a normal CMOS device or other kinds of devices (resistors, capacitor, etc.), as is known in the art. Portions of this layer are then typically removed (using dry etching or wet etching) at locations where this layer is not desired to be deposited. However, in the present invention, portions of the protective layer 36 are retained and operate to isolate the sensor 33 from the bird's beak 35. The protective layer 36 is preferably made from a transparent material so as not to decrease the amount of light received or detected by the sensor device 30, and has a certain thickness to protect the portions that it has covered (i.e., in particular, the region adjacent the bird's beak 35) from further processing damage. The materials that can be used for the protective layer 36 include a dielectric, an insulative material, or a conductive material (such as a nitride, oxide, oxynitride, polysilicon, polycide and titanium nitride, among others). The protective layer 36 is applied on to the bird's beak 35 with an overlap distance 34 after manufacturing of the field oxide layer 32. This protective layer 36 also operates as a self-aligned mask for the formation of the sensor 33 in a later process step, so that the sensor device 30 does not require the application and use of a photoresist as a shield layer to form the sensor 33. After the protective layer 36 has been formed, the sensor 33 can be formed by the impurity diffusion or ion implantation as used by sensor devices 10 and 20.

As shown in FIG. 3, portions of the sensor 33 define a distance 34 to the bird's beak 35. This distance 34 can be smaller than the distance 24 in sensor device 20 because the bird's beak 35 has been protected by the protective layer 36 so that no current leakage path will be increased by further processing damage. In this regard, the distance 34 can be less than 0.2 um because the application of the protective layer 36 during the manufacturing process ensures that it is accurately aligned over the bird's beak or edge 35 of the field oxide layer 32.

The advantages of the sensor device 30 are immediately apparent. First, the protective layer 36 protects the region of the sharp edges 35, so that these sharp edges 35 will not be affected by the further processing during the manufacture of the sensor device 30, thereby minimizing the formation of a current leakage path. Second, since the protective layer 36 is made of a transparent material, the light detection performance of the effective sensor area will not be affected. Third, the sensor device 30 minimizes current leakage at the sharp edges 35 while only slightly decreasing the effective area EA of the sensor 33. For example, the sensor area of sensor device 30 can be 10 um by 10 um, and the effective sensor area (EA) of sensor 33 can be 9.8 um by 9.8 um, thereby resulting in only a four percent decrease in the effective area EA. This minimizes the effect on the capacitance of the sensor 33, so that the sensitivity and dynamic range of the sensor 33 will not be adversely affected. Because the sensitivity is proportional to the signal level and the leakage current is proportional to the noise level, the signal-to-noise (S/N) ratio of sensor 33 can be improved.

During the normal reading operation performed by the sensor device 30, the number of white pixels (or hot lines or dead pixels or dead lines) in one chip ranges from about 0 to 4, and the number of chips in a wafer which do not exhibit white pixels is about 80%. Thus, when compared to the similar numbers set forth above for the conventional sensor device 10 and for the sensor device 20, the sensor device 30 exhibits improved yield rates from 10% to 45% to 80%.

Thus, the present invention provides methods and structures that are effective in minimizing current leakage. The sensor devices 20 and 30 provided by the present invention are all directed at protecting the weak region adjacent the junction between the bird's beak 25, 35 and the sensor 22, 33. In one embodiment, a gap or distance 24 is provided between the bird's beak 25 and the sensor 22 to break the current leakage path. In another embodiment, a protective layer 36 is applied over the weak region to further protect the weak region. Where the protective layer 36 is provided, the effective sensor area EA of the sensor 33 is only minimally decreased, so that the sensitivity and dynamic range of the sensor device 30 will not be adversely affected. The presence of the two embodiments further provides the practitioner with two different options, all which are effective in minimizing the current leakage.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A CMOS sensor device comprising:

a substrate;

a field-oxide layer deposited over the substrate and having opposing sharp edges that define a window;

a sensor formed in the window with a distance between the sensor and each sharp edge that defines the window;

wherein the window exposes a portion of the sensor.

2. The sensor device of claim 1, wherein the distance is greater than 0.5 um.

3. The sensor device of claim 1, wherein the sensor is a P-N junction sensor area.

4. The sensor device of claim 3, wherein the substrate is selected from the group consisting of a P-well, N-well, P-substrate and N-substrate.

5. The sensor device of claim 1, further comprising a protective layer disposed over the distance and the sharp edges of the field oxide layer.

6. The sensor of claim 5, wherein the protective layer is one of a conductive layer, an insulative layer, and a dielectric layer for use during CMOS manufacturing.

7. The sensor device of claim 5, wherein the protective layer is made of a material selected from the group consisting of a dielectric, an insulative material, and a conductive material.

8. The sensor device of claim 5, wherein the protective layer is transparent.

9. The sensor device of claim 5, wherein the distance is 0.2 um.

10. The sensor device of claim 5, wherein the protective layer provides a self-aligned mask for forming the sensor.

* * * * *